(12) United States Patent
Tian

(10) Patent No.: US 11,368,032 B2
(45) Date of Patent: Jun. 21, 2022

(54) TEST SYSTEM AND TEST METHOD FOR CHARGING DEVICE

(71) Applicant: GUANGDONG OPPO MOBILE TELECOMMUNICATIONS CORP., LTD., Guangdong (CN)

(72) Inventor: Chen Tian, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 259 days.

(21) Appl. No.: 16/626,258

(22) PCT Filed: Sep. 30, 2018

(86) PCT No.: PCT/CN2018/109082
§ 371 (c)(1),
(2) Date: Dec. 23, 2019

(87) PCT Pub. No.: WO2020/062237
PCT Pub. Date: Apr. 2, 2020

(65) Prior Publication Data
US 2021/0408813 A1 Dec. 30, 2021

(51) Int. Cl.
*G01R 31/30* (2006.01)
*H02J 7/00* (2006.01)
(Continued)

(52) U.S. Cl.
CPC ............ *H02J 7/0047* (2013.01); *G01R 31/40* (2013.01); *H02J 7/0029* (2013.01); *H02J 7/06* (2013.01)

(58) Field of Classification Search
USPC ........................................ 324/426, 433, 435
See application file for complete search history.

(56) References Cited

U.S. PATENT DOCUMENTS

| | | | |
|---|---|---|---|
| 2010/0013442 A1 | 1/2010 | Yamazaki et al. | |
| 2013/0346025 A1* | 12/2013 | Schulz | B60L 53/60 |
| | | | 702/182 |

(Continued)

FOREIGN PATENT DOCUMENTS

| | | |
|---|---|---|
| CN | 1548977 A | 11/2004 |
| CN | 101604861 A | 12/2009 |

(Continued)

OTHER PUBLICATIONS

Chinese First Office Action with English Translation for CN Application 201880023344.0 dated Jul. 5, 2021. (22 pages).

(Continued)

*Primary Examiner* — Vincent Q Nguyen
(74) *Attorney, Agent, or Firm* — Young Basile Hanlon & MacFarlane, P.C.

(57) ABSTRACT

The present disclosure provides a test system and a test method for a charging device. The test system for the charging device includes a charging device and a power supply module. The charging device has a switch tube and a control module. The power supply module is coupled to a control electrode of the switch tube and is configured to output a voltage signal to the control electrode of the switch tube, so that a voltage between a first end and a second end of the switch tube is greater than a preset voltage protection value. The control module is configured to determine whether the charging device enters a protection state when the voltage between the first end and the second end of the switch tube is greater than the preset voltage protection value, thereby testing a protection function against abnormal voltage drop of the charging device.

18 Claims, 6 Drawing Sheets

(51) Int. Cl.
    *G01R 31/40*     (2020.01)
    *H02J 7/06*     (2006.01)

(56) References Cited

U.S. PATENT DOCUMENTS

| | | | |
|---|---|---|---|
| 2017/0179741 | A1 | 6/2017 | Tian et al. |
| 2017/0187287 | A1* | 6/2017 | Zuo ........................ H02M 3/158 |

FOREIGN PATENT DOCUMENTS

| | | | |
|---|---|---|---|
| CN | 101697410 | A | 4/2010 |
| CN | 101860051 | A | 10/2010 |
| CN | 102136717 | A | 7/2011 |
| CN | 102667513 | A | 9/2012 |
| CN | 202583381 | U | 12/2012 |
| CN | 103698640 | A | 4/2014 |
| CN | 103795040 | A | 5/2014 |
| CN | 104166057 | A | 11/2014 |
| CN | 203981802 | U | 12/2014 |
| CN | 104375021 | A | 2/2015 |
| CN | 204376505 | U | 6/2015 |
| CN | 104931839 | A | 9/2015 |
| CN | 106030961 | A | 10/2016 |
| CN | 206060301 | U | 3/2017 |
| CN | 106602518 | A | 4/2017 |
| CN | 107240944 | A | 10/2017 |
| CN | 108448667 | A | 8/2018 |
| JP | H09251063 | A | 9/1997 |
| JP | H1056742 | A | 2/1998 |
| JP | H10290530 | A | 10/1998 |
| JP | 2000050506 | A | 2/2000 |
| JP | 2001228939 | A | 8/2001 |
| JP | 2008061343 | A | 3/2008 |
| JP | 2016506236 | A | 2/2016 |
| KR | 20050046838 | A | 5/2005 |
| KR | 20160136283 | A | 11/2016 |

OTHER PUBLICATIONS

Indian Examination Report for IN Application 202017001790 dated Jun. 23, 2021. (4 pages).
Zhang Yanhong, The Low Power Protection Circuit Design of Lithium-ion Battery, Huazhong University of Science & Technology, May 2006, 70 pages.
Japanese Office Action with English Translation for JP Application 2020-504415 dated Feb. 26, 2021. (9 pages).
Extended European Search Report for EP application 18935414.5 dated Dec. 7, 2020.
ISR with English translation for PCT application PCT/CN2018/109082, dated 2018.
Korean Notice of Allowance with English Translation for KR Application 1020207002652 dated Nov. 3, 2021. (4 pages).

* cited by examiner

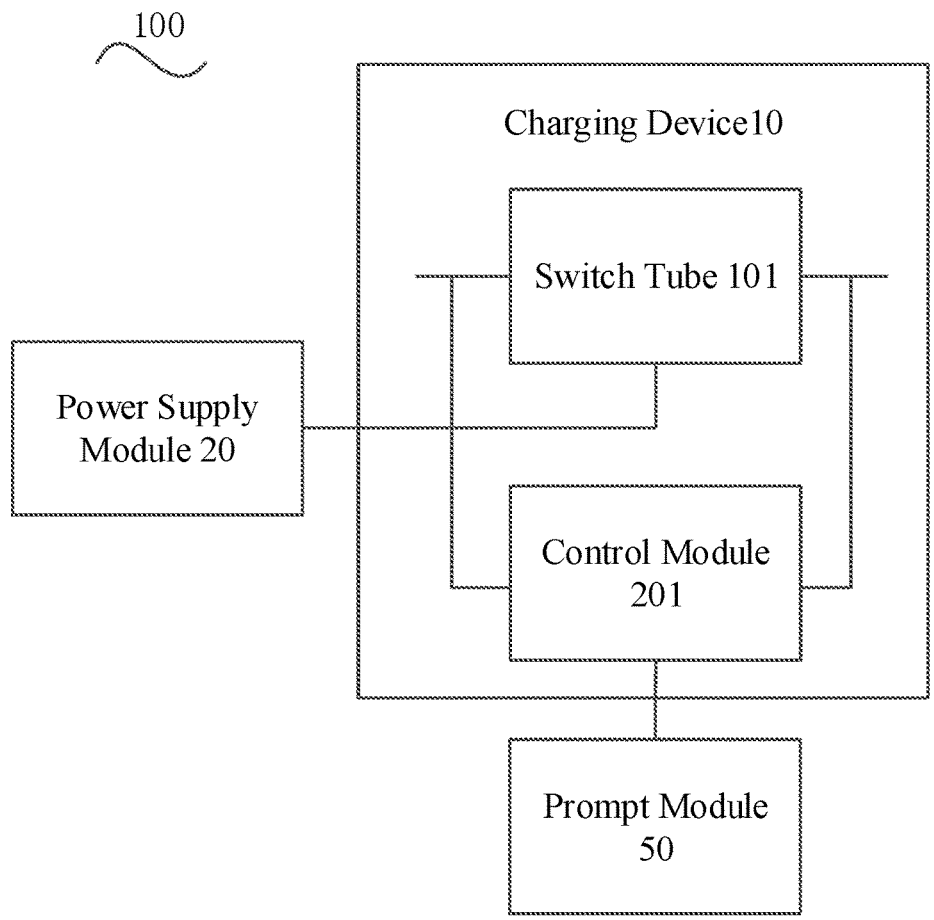

FIG. 6

| outputting by a power supply module, a voltage signal to a control electrode of a switch tube in the charging device, so that a voltage between a first end and a second end of the switch tube is greater than a preset voltage protection value | ⟶ S1 |

| determining an operating state of the charging device when the voltage between the first end and the second end of the switch tube is greater than the preset voltage protection value, thereby testing the protection function against abnormal voltage drop of the charging device | ⟶ S2 |

FIG. 7

TEST SYSTEM AND TEST METHOD FOR CHARGING DEVICE

CROSS-REFERENCE TO RELATED APPLICATION(S)

This application is a 371 application of International Application No. PCT/CN2018/109082, filed on Sep. 30, 2018, the entire disclosure of which is hereby incorporated by reference.

TECHNICAL FIELD

The present disclosure relates to a field of charging technology, and more particularly, to a test system for a charging device and a test method for the charging device.

BACKGROUND

A switch tube is usually provided in a charging device, for example, an adapter, as an output switch. In practical use, when a voltage drop of the switch tube exceeds a certain limit value, the switch tube is considered to be in an abnormal state and enters a protection state. However, in the related art, there is no solution for testing whether the charging device may enter the protection state in the abnormal state, so that the safety and stability of the charging device is affected.

SUMMARY

Embodiments of a first aspect of the present disclosure provide a charging system for a charging device. The system includes: a charging device, comprising a switch tube and a control module; and a power supply module, coupled to a control electrode of the switch tube and configured to output a voltage signal to the control electrode of the switch tube, so that a voltage between a first end and a second end of the switch tube is greater than a preset voltage protection value. The control module is configured to determine whether the charging device enters a protection state when the voltage between the first end and the second end of the switch tube is greater than the preset voltage protection value, thereby testing a protection function against abnormal voltage drop of the charging device.

Embodiments of a second aspect of the present disclosure provide a test method for a charging device. The method includes: outputting a voltage signal to a control electrode of a switch tube in the charging device, so as to enable a voltage between a first end and a second end of the switch tube to be greater than a preset voltage protection value; and determining an operating state of the charging device when the voltage between the first end and the second end of the switch tube is greater than the preset voltage protection value, thereby testing a protection function against abnormal voltage drop of the charging device.

Additional aspects and advantages of embodiments of present disclosure will be given in part in the following descriptions, become apparent in part from the following descriptions, or be learned from the practice of the embodiments of the present disclosure.

BRIEF DESCRIPTION OF DRAWINGS

These and other aspects and advantages of embodiments of the present disclosure will become apparent and more readily appreciated from the following descriptions made with reference to the accompanying drawings.

FIG. 6 is a block diagram of a test system for a charging device according to an embodiment of the present disclosure, in which a prompt module is provided.

FIG. 7 is a flow chart of a test method for a charging device according to embodiments of the present disclosure.

DETAILED DESCRIPTION

Figure 1:
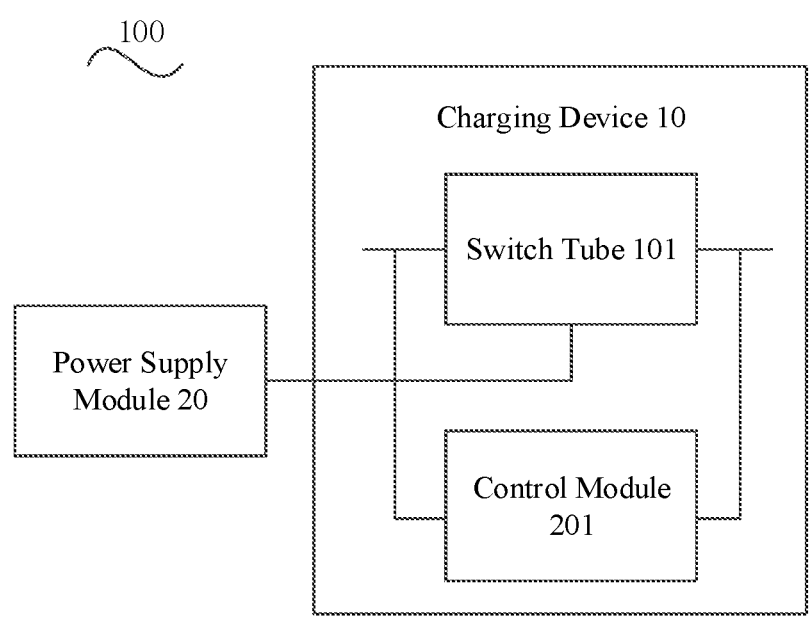
FIG. 1 is a block diagram of a test system for a charging device according to embodiments of the present disclosure.

Embodiments of the present disclosure are described below in detail, and examples of the embodiments are shown in accompanying drawings, throughout which, reference signs that are the same or similar represent the same or similar components or components that have the same or similar functions. The embodiments described below with reference to the accompanying drawings are illustrative, are merely used to explain the present disclosure, and cannot be construed as a limit to the present disclosure.

A test system and a test method for a charging device according to embodiments of the present disclosure will be described below with reference to the accompanying drawings, in which the test system and the test method for the charging device is configured to test a protection function against abnormal voltage drop of the charging device.

In an embodiment of the present disclosure, the charging device is configured to charge a device to be charged. The device to be charged may refer to a terminal, which may include, but is not limited to, a smart phone, a computer, a personal digital assistant (PDA), a wearable device, a Bluetooth headset, a gaming device, a camera device and so on. The charging device may be a device having a function of charging the terminal, such as an adapter, a portable power supply (a power bank), or an in-vehicle charger. Taking the adapter as an example, the charging device may be a VOOC adapter, and a charging circuit of the VOOC adapter may be directly coupled to a battery of the device to be charged through a charging interface.

It may be understood that the charging device is provided with a switch tube. The switch tube is configured to control the charging device to turn on or turn off power output. In practical use, a pseudo soldering or an insufficient driving voltage may lead to a resistance state of the switch tube, resulting in that the charging device may continuously generate heat or even be burned down during charging. In order to prevent the charging device from continuously generating heat or even being burned down during the charging, the charging device is provided with the protection function against abnormal voltage drop, namely, the voltage drop on the switch tube is detected. When the voltage drop of the switch tube exceeds a limit value, it is considered that an abnormal voltage drop occurs and the charging device enters a protection state.

Therefore, with the test system for the charging device provided by embodiment of the present disclosure, the abnormal voltage drop is simulated in a test of the charging device and whether the charging device enters the protection state or not is checked. For example, a voltage is applied to a control electrode of the switch tube, and an impedance of the switch tube is adjusted by controlling the voltage of the control electrode. After that, when the voltage drop of the switch tube reaches the limit value, namely the abnormal voltage drop occurs, it is checked whether the charging device enters the protection state. In this manner, the effectiveness of the protection function against abnormal voltage drop is verified.

Hereinafter, a test system for a charging device according to embodiments of the present disclosure will be described in detail with reference to FIGS. 1 to 6.

Figure 2:
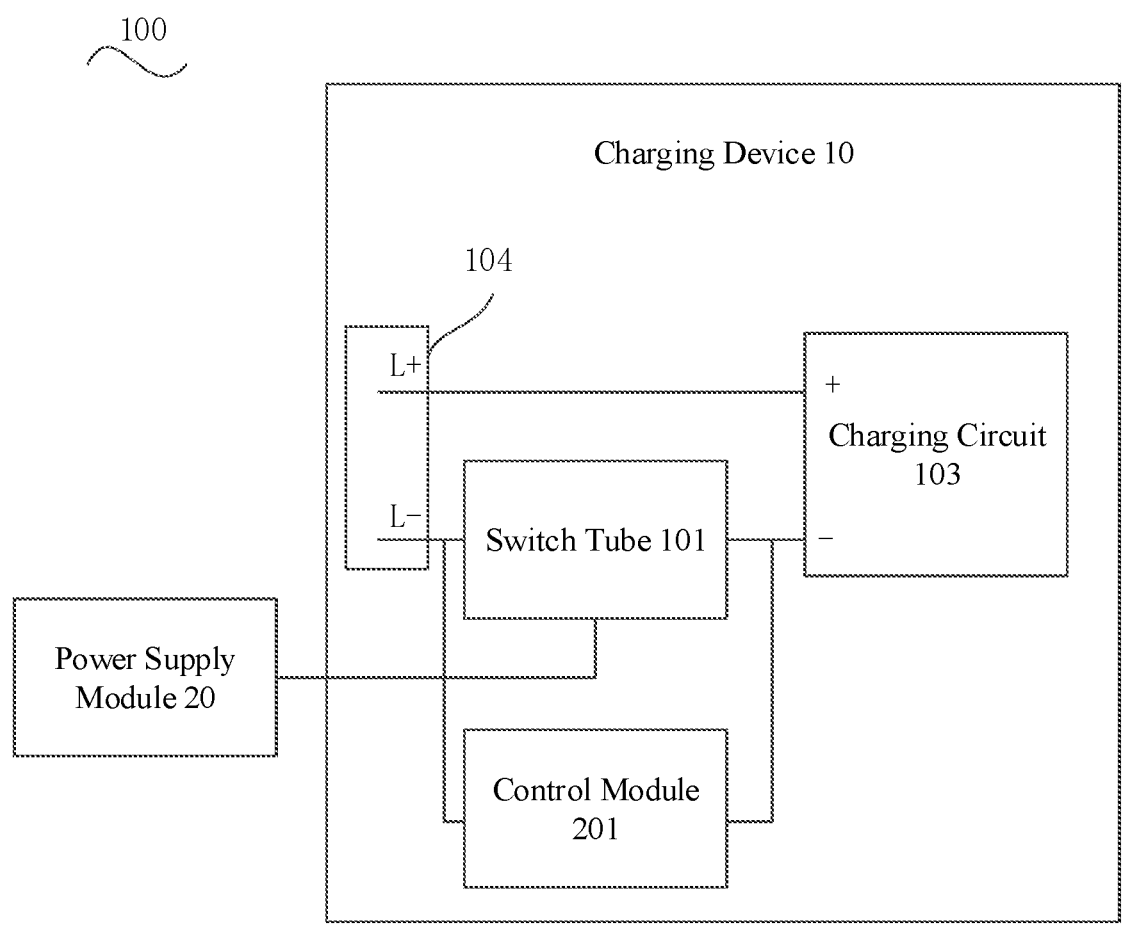
FIG. 2 is a block diagram of a test system for a charging device according to an embodiment of the present disclosure.

As illustrated in FIGS. 1-2, a test system 100 for the charging device according to embodiments of the present disclosure includes: a charging device 10 and a power supply module 20.

The charging device 10 is internally provided with a switch tube 101 and a control module 102. For example, the switch tube 101 may be provided at an output end of a charging circuit 103 in the charging device 10. When the switch tube 101 is turned on, the output end of the charging circuit 103 performs an output, and when the switch tube 101 is turned off, the output end of the charging circuit 103 stops the output. The control module 102 may be coupled to the control electrode of the switch tube 101. When the charging device 10 charges the device to be charged, that is, the protection function against abnormal voltage drop is not tested, the switch tube 101 may be turned on or off under the control of the control module 102. The control module 102 may be an MCU (micro-controller unit).

The charging device 10 may further have a charging interface 104. The charging interface 104 has a power line. The charging device 10 may output power to the outside through the power line in the charging interface 104, for example, for charging a battery of the device to be charged, or outputting power to a load module. Specifically, as illustrated in FIG. 2, the charging interface 104 has a positive power line L+ and a negative power line L−. The positive power line L+ is coupled to a positive output end+ of the charging circuit 103 in the charging device 10, and the negative power line L− is coupled to a negative output end− of the charging circuit 103 in the charging device 10. The switch tube 101 is coupled in series with the positive power line L+ or the negative power line L−. For example, when the charging device 10 is coupled to the device to be charged through the charging interface 104, the positive power line L+ and the negative power line L− may be coupled to a positive electrode and a negative electrode of a battery, respectively, to charge the battery of the device to be charged.

Therefore, by controlling the switch tube 101 to turn on or off, the positive power line L+ or the negative power line L− may be controlled to be coupled to or disconnected from the charging circuit 103, thereby controlling power output of the charging device 10.

The power supply module 20 is coupled to the control electrode of the switch tube 101, and is configured to output a voltage signal to the control electrode of the switch tube 101, so that a voltage drop of the switch tube 101, i.e., a voltage between a first end and a second end of the switch tube 101, is greater than a preset voltage protection value.

The control module 102 is configured to determine whether the charging device 10 enters the protection state when the voltage between the first end and the second end of the switch tube 101 is greater than the preset voltage protection value, thereby testing the protection function against abnormal voltage drop of the charging device 10.

It may be understood that the charging device 10 may further be internally provided with a voltage detection unit. The control module 102 may detect the voltage between the first end and the second end of the switch tube 101 through the voltage detection unit, and control the charging device 10 to enter the protection state when the protection function against abnormal voltage drop of the charging device 10 works well and the voltage between the first end and the second end of the switch tube 101 is greater than the preset voltage protection value. When the protection function against abnormal voltage drop of the charging device 10 fails or when the voltage between the first end and the second end of the switch tube 101 is less than or equal to the preset voltage protection value, the charging device 10 is controlled to be in a normal working state.

When the protection function against abnormal voltage drop of the charging device 10 is tested, a voltage signal is output by the power supply module 20 to the control electrode of the switch tube 101, and a voltage drop of the switch tube 101 is adjusted by adjusting a voltage value of the voltage signal. When the voltage drop of the switch tube 101 is greater than the preset voltage protection value, i.e., an abnormal voltage drop is simulated, it is determined whether the charging device enters the protection state, and further, it is determined whether the charging device has protection function against abnormal voltage drop. In other words, If the charging device enters the protection state, it is determined that the charging device has the protection function against abnormal voltage drop or the protection function against abnormal voltage drop is effective. If the charging device does not enter the protection state, it is determined that the charging device does not have the protection function against abnormal voltage drop or the protection function against abnormal voltage drop fails.

Therefore, whether the protection function against abnormal voltage drop of the charging device is normal or not may be effectively tested, thereby ensuring the safety and the stability of the charging device, preventing after-sale problems of the charging device caused by an abnormality of the protection function against abnormal voltage drop, and guaranteeing the quality of the charging device.

According to some embodiments of the present disclosure, the voltage value of the voltage signal output by the power supply module 20 may be manually adjusted or may be automatically adjusted under the control of a controller. For example, in a case of manual adjustment, a user may manually input a voltage value or a voltage variation, and then the power supply module 20 may adjust the voltage value of the voltage signal according to the voltage value or the voltage variation manually input by the user. For another example, in a case of automatic adjustment, the controller may generate a voltage value or a voltage variation according to the voltage drop of the switch tube 101, and then the power supply module 20 may adjust the voltage value of the voltage signal according to the voltage value or the voltage variation generated by the controller.

Figure 3:
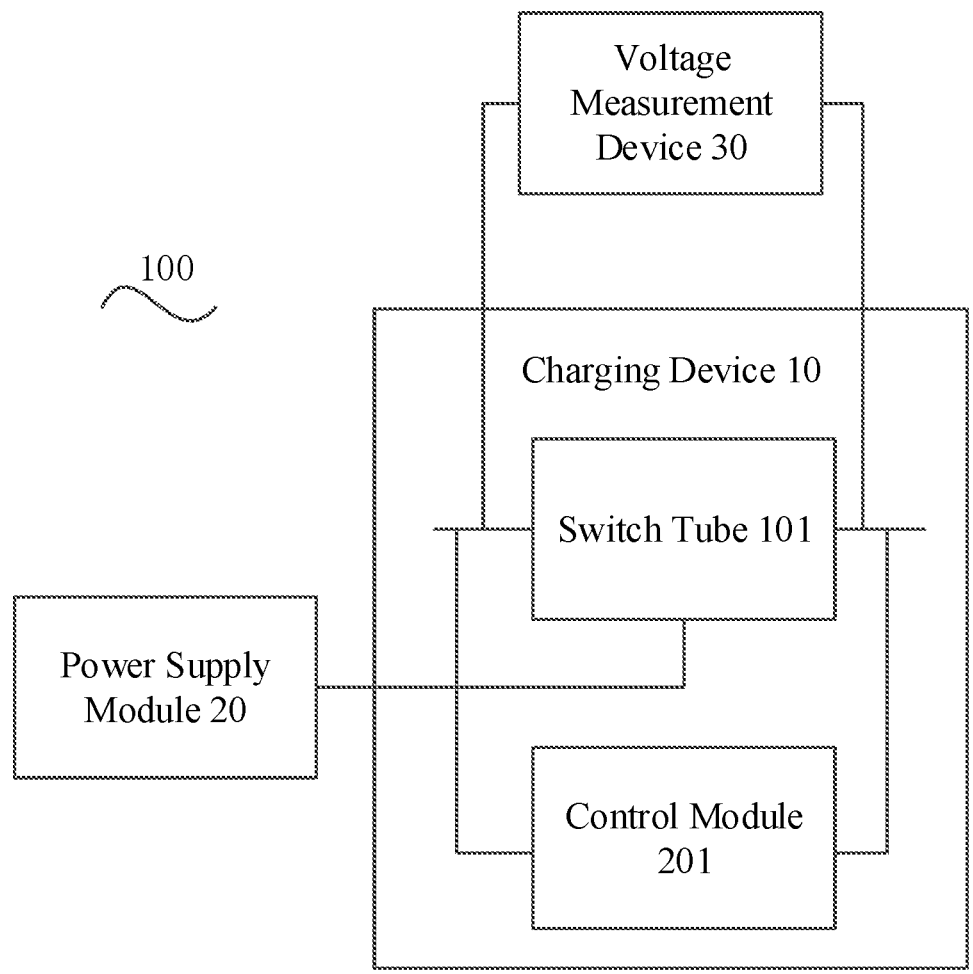
FIG. 3 is a block diagram of a test system for a charging device according to an embodiment of the present disclosure, in which a voltage measurement device is provided.

Specifically, as illustrated in FIG. 3, the test system 100 for the charging device may further include a voltage measurement device 30. The voltage measurement device 30 is coupled to the first end and the second end of the switch tube 101, and is configured to measure the voltage between the first end and the second end of the switch tube 101, so that adjusting the voltage value of the voltage signal output by the power supply module 20 is stopped when the voltage between the first end and the second end of the switch tube 101 reaches the preset voltage protection value. The voltage measurement device 30 may be a multimeter.

In the case of manual adjustment, after each time the user adjusts the voltage value of the voltage signal of the power supply module 20, the power supply module 20 may output a voltage signal with a corresponding voltage value to the control electrode of the switch tube 101 according to the adjustment of the user. After that, the voltage drop of the switch tube 101 is measured by the voltage measurement device 30. The user may check the measured voltage drop through the voltage measurement device 30. When the voltage drop of the switch tube 101 reaches the preset voltage protection value, the adjustment to the voltage value of the voltage signal of the power supply module 20 is stopped. When the voltage drop of the switch tube 101 does not reach the preset voltage protection value, the adjustment to the voltage value of the voltage signal of the power supply module 20 is continued until the voltage drop of the switch tube 101 reaches the preset voltage protection value.

Similarly, in the case of automatic adjustment through the controller, after each time the controller adjusts the voltage value of the voltage signal of the power supply module 20, the power supply module 20 may output the voltage signal with the corresponding voltage value to the control electrode of the switch tube 101, and then the controller obtains the voltage drop of the switch tube 101 through the voltage measurement device 30. When the voltage drop of the switch tube 101 reaches the preset voltage protection value, the controller stops adjusting the voltage value of the voltage signal of the power supply module 20. When the voltage drop of the switch tube 101 does not reach the preset voltage protection value, the controller continues to adjust the voltage value of the voltage signal of the power supply module 20 until the voltage drop of the switch tube 101 reaches the preset voltage protection value.

Figure 4:
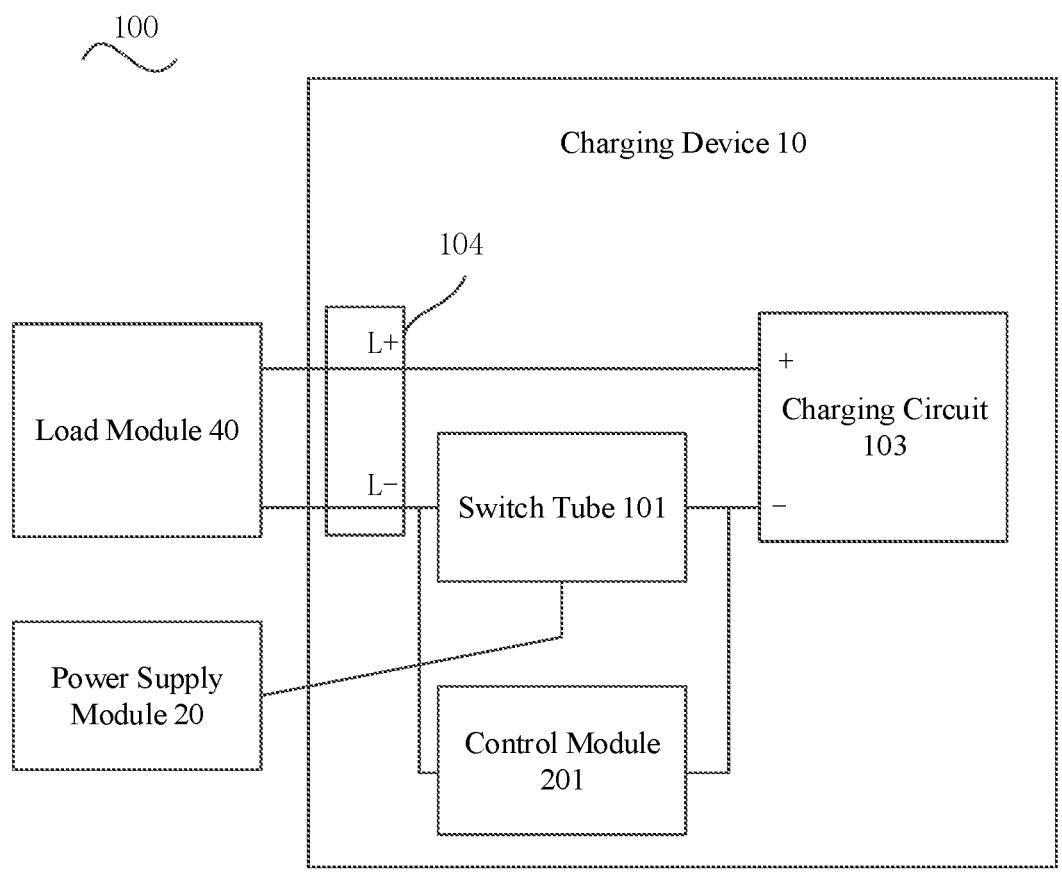
FIG. 4 is a block diagram of a test system for a charging device according to an embodiment of the present disclosure, in which a load module is provided.

According to an embodiment of the present disclosure, as illustrated in FIG. 4, the charging device 10 may be coupled to a load module 40. For example, the charging device 10 may be coupled to the load module 40 through the charging interface 104, in which the first end or the second end of the switch tube 101 may be coupled to the load module 40 through the charging interface 104. As an example, the load module 40 may be a constant current load. For example, when the load module 40 is an electronic load, the electronic load is in a constant current mode, so that a current in a loop where the electronic load is located is kept constant.

It may be understood that, when the charging interface 104 is coupled to the load module 40, the charging circuit 103 in the charging device 10 and the load module 40 form a loop. Since the load module 40 may be a constant current load, the current in the loop is constant, i.e. the current flowing through the switch tube 101 is constant. Therefore, extracting fixed current through the load module 40 facilitates an adjustment to the voltage signal of the power supply module 20, and the voltage drop of the switch tube 101 may be gradually increased by gradually decreasing or increasing the voltage value of the voltage signal.

Figure 5:
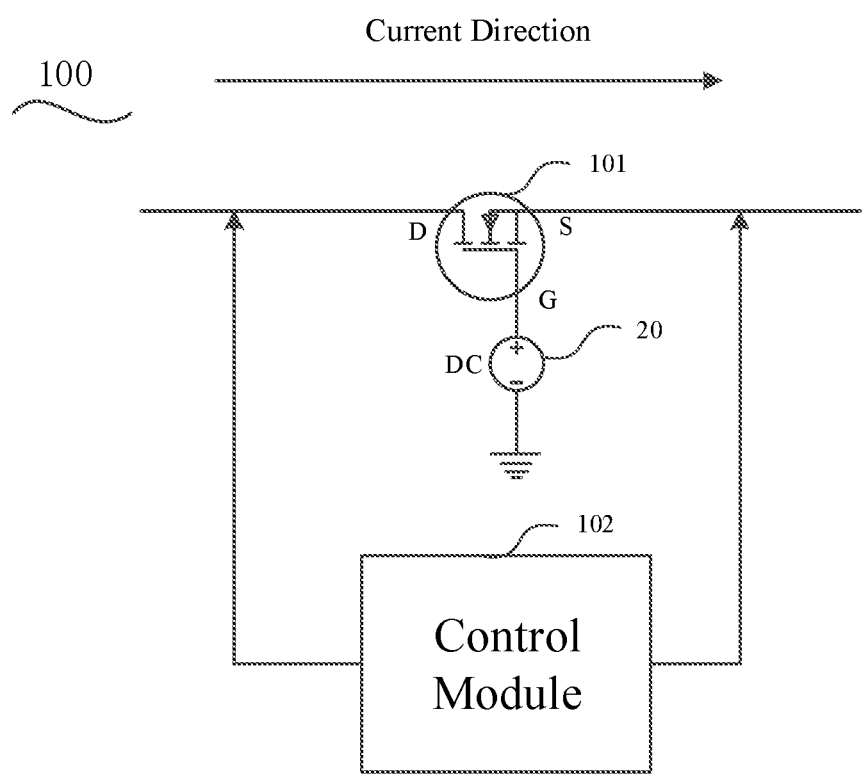
FIG. 5 is a schematic diagram illustrating a circuitry of a test system for a charging device according to an embodiment of the present disclosure.

As an example, the switch tube 101 may be a MOS transistor or a triode. For example, as illustrated in FIG. 5, a drain D of the MOS transistor may be the first end of the switch tube 101, a source S of the MOS transistor may be the second end of the switch tube 101, and a gate G of the MOS transistor may be the control electrode of the switch tube 101. The drain D of the MOS transistor may be coupled to the charging circuit 103 in the charging device 10, the source S of the MOS transistor may be coupled to the charging interface 104, and the gate G of the MOS transistor is coupled to the control module 102. The current may flow in from the drain D of the MOS transistor and flow out from the source S of the MOS transistor. The direction of the current is shown by the arrow in FIG. 5.

Further, the switch tube 101 may be an N-type switch tube, such as an NMOS transistor or an NPN triode, such that the voltage value of the voltage signal output by the power supply module 20 may be gradually decreased. Taking the NMOS transistor as an example, the lower the voltage value of the voltage signal output by the power supply module 20 is, the larger an impedance between the drain D and the source S of the NMOS transistor is, and the larger the voltage drop between the drain D and the source S of the NMOS transistor is since the fixed current is drawn by the load module 40 and the current flowing through the NMOS transistor is constant. When the voltage value of the voltage signal of the power supply module 20 is lower than a certain voltage value, the voltage drop of the NMOS transistor will be greater than the preset voltage protection value.

Alternatively, the switch tube 101 may be a P-type switch tube, such as a PMOS transistor or a PNP triode, such that the voltage value of the voltage signal output by the power supply module may be gradually increased. Taking the PMOS transistor as an example, the higher the voltage value of the voltage signal output by the power supply module 20 is, the higher an impedance between the drain D and the source S of the PMOS transistor is, and the larger the voltage drop between the drain D and the source S of the PMOS transistor is since fixed current is drawn by the load module 40 and the current flowing through the PMOS transistor is constant. When the voltage value of the voltage signal of the power supply module 20 is higher than a certain voltage value, the voltage drop of the PMOS transistor will be greater than the preset voltage protection value.

Accordingly, in this embodiment of the present disclosure, an N-type switch tube is taken as an example for description. By adjusting the output voltage (i.e., the voltage value of the voltage signal output by the power supply module 20) of the power supply module 20 on the control electrode of the switch tube 101, the impedance of the switch tube 101 is adjusted, and the lower the output voltage of the power supply module 20 is, the higher the impedance of the N-type switch tube is. The voltage drop across two ends of the switch tube 101 is measured in real time by the multimeter. The charging device 10 extracts the fixed current by using the load module 40 and the output voltage of the power supply module 20 is adjusted. When the output voltage of the power supply module 20 is lower than a certain voltage value, namely, the voltage drop across two ends of the switch tube 101 is greater than the preset voltage protection value, it is checked whether the charging device 10 may enter the protection state, thereby determining whether the charging device 10 has the protection function against abnormal voltage drop. Consequently, whether the protection function against abnormal voltage drop of the charging device is normal or not may be tested, the safety and the stability of the charging device are ensured, the after-sale problems of the charging device caused by an abnormality of the protection function against abnormal voltage drop are avoided, and the quality of the charging device is guaranteed.

As an example, as illustrated in FIG. 5, the power supply module 20 may be a direct current power supply DC. The positive electrode of the direct current power supply DC is coupled to the control electrode of the switch tube 101, and the negative electrode of the direct current power supply DC is grounded. It may be understood that, when the charging device 10 is tested for the protection function against abnormal voltage drop, the charging device 10 may be turned on, the positive electrode of the direct current power supply DC may be directly coupled to the control electrode of the switch tube 101, and the negative electrode of the direct current power supply DC may be coupled to a reference ground of the charging device 10.

According to an embodiment of the present disclosure, as illustrated in FIG. 6, the test system 100 for the charging device may further include a prompt module 50. The prompt module 50 is coupled to the control module 102, and may provide a prompt on the test result of the protection function against abnormal voltage drop or the protection state of the charging device 10 under the control of the control module 102, so that a user may obtain the test result straightforwardly.

It may be understood that, when the voltage drop of the switch tube 101 reaches the preset voltage protection value, the control module 102 may control the prompt module 50 to send a prompt message according to the test result of the protection function against abnormal voltage drop or the protection state of the charging device 10, and thus the user may obtain the test result straightforwardly through the prompt message sent by the prompt module 50, thereby determining whether the charging device has the protection function against abnormal voltage drop.

For example, when the output voltage of the power supply module 20 is manually adjusted so that the voltage drop of the switch tube 101 reaches the preset voltage protection value, the user may check whether the prompt module 50 sends a prompt indicating that the charging device enters the protection state. When the prompt module 50 sends a prompt indicating that the charging device enters the protection state, it is determined that the charging device has the protection function against abnormal voltage drop or the protection function against abnormal voltage drop is effective. When the prompt module 50 does not send a prompt indicating that the charging device enters the protection state, it is determined that the charging device does not have the protection function against abnormal voltage drop or the protection function against abnormal voltage drop is ineffective.

For another example, when the output voltage of the power supply module 20 is automatically adjusted by the controller so that the voltage drop of the switch tube 101 reaches the preset voltage protection value, the controller may send a state prompt instruction to the control module 102. After receiving the state prompt instruction, the control module 102 may send information indicating the protection state of the charging device 10 to the prompt module 50, and then the prompt module 50 may send a prompt message according to the received information. When the prompt module 50 sends a prompt indicating that the charging device enters the protection state, it is determined that the charging device has the protection function against abnormal voltage drop or the protection function against abnormal voltage drop is effective. When the prompt module 50 does not send a prompt indicating that the charging device enters the protection state, it is determined that the charging device does not have the protection function against abnormal voltage drop or the protection function against abnormal voltage drop is ineffective.

As an example, the prompt module 50 may be integrated with the charging device 10, for example, the prompt module 50 may be an indicator light on the charging device 10. Alternatively, the prompt module 50 may communicate with the control module 102 in the charging device 10. In other words, the control module 102 may send information indicating the test result of the protection function against abnormal voltage drop or the protection state of the charging device 10 to the prompt module 50, and then the prompt module 50 may send out the prompt message according to the received information. For example, the prompt module 50 may be a display, and the display may display the test result of the protection function against abnormal voltage drop or whether the charging device 10 enters the protection state.

To sum up, according to the test system for the charging device provided by embodiments of the present disclosure, the voltage signal is output by the power supply module to the control electrode of the switch tube, so that the voltage between the first end and the second end of the switch tube is greater than the preset voltage protection value, and the control module determines whether the charging device enters the protection state when the voltage between the first end and the second end of the switch tube is greater than the preset voltage protection value, thereby testing the protection function against abnormal voltage drop of the charging device. Therefore, whether the protection function against abnormal voltage drop of the charging device is normal or not is effectively tested, ensuring the safety and the stability of the charging device, avoiding the after-sale problems of the charging device caused by an abnormality of the protection function against abnormal voltage drop, and guaranteeing the quality of the charging device.

Corresponding to the test system for the charging device in the foregoing embodiments, the present disclosure further provides a test method for a charging device.

FIG. 7 is a flow chart of a test method for a charging device according to embodiments of the present disclosure. As illustrated in FIG. 7, the test method for the charging device includes the followings.

At block S1, a voltage signal is output by a power supply module to a control electrode of a switch tube in the charging device, so that a voltage between a first end and a second end of the switch tube is greater than a preset voltage protection value.

At block S2, when the voltage between the first end and the second end of the switch tube is greater than the preset voltage protection value, an operating state of the charging device is determined, thereby testing a protection function against abnormal voltage drop of the charging device.

According to an embodiment of the present disclosure, the first end or the second end of the switch module is coupled to a load module through a charging interface of the charging device, in which the load module is a constant current load.

According to an embodiment of the present disclosure, the switch tube is the N-type switch tube, for gradually reducing the voltage value of the voltage signal output by the power supply module.

According to an embodiment of the present disclosure, the switch tube is the P-type switch tube, for gradually increasing the voltage value of the voltage signal output by the power supply module.

According to an embodiment of the present disclosure, the voltage between the first end and the second end of the switch tube is measured by a voltage measurement device, so that adjusting the voltage value of the voltage signal output by the power supply module is stopped when the voltage between the first end and the second end of the switch tube reaches the preset voltage protection value.

According to an embodiment of the present disclosure, the voltage between the first end and the second end of the switch tube is detected by a voltage detection unit of the charging device, and the charging device is controlled to enter the protection state when the protection function against abnormal voltage drop of the charging device is normal and the voltage between the first end and the second end of the switch tube is greater than the preset voltage protection value.

According to an embodiment of the present disclosure, the test method for the charging device further includes: providing by a prompt module, a prompt on the test result of the protection function against abnormal voltage drop or the protection state of the charging device.

It should be noted that the above explanation on the embodiments of the test system for the charging device is also applicable to the test method for the charging device according to this embodiment, and is not repeated herein.

In summary, according to the test method for the charging device provided by embodiments of the present disclosure, the voltage signal is output by the power supply module to the control electrode of the switch tube, so that the voltage between the first end and the second end of the switch tube is greater than the preset voltage protection value; and then, it is determined that whether the charging device enters the protection state when the voltage between the first end and the second end of the switch tube is greater than the preset voltage protection value, thereby testing the protection function against abnormal voltage drop. Therefore, whether the protection function against abnormal voltage drop of the charging device is normal or not is effectively tested, ensuring safety and stability of the charging device, preventing after-sale problems of the charging device caused by an abnormality of the protection function against abnormal voltage drop, and guaranteeing the quality of the charging device.

Those skilled in the art could be aware that, example units and algorithm steps described in combination with embodiments disclosed herein may be implemented by electronic hardware, or by a combination of computer software and electronic hardware. Whether these functions are executed by hardware or software is dependent on particular use and design constraints of the technical solutions. Professionals may adopt different methods for different particular uses to implement described functions, which should not be regarded as going beyond the scope of the present disclosure.

It is clear to those skilled in the art that, for convenience and brevity of description, the specific operating processes of the system, device and unit described above may refer to corresponding processes in the foregoing method embodiments, and are not described herein again.

In several embodiments provided by the present disclosure, it should be understood that, the disclosed system, device and method may be implemented in other ways. For example, the device embodiments described above are merely illustrative. For example, the units are merely divided according to logic functions, and can be divided in other ways in actual implementation. For example, a plurality of units or components may be combined or may be integrated into another system, or some features may be ignored or not executed. In addition, the mutual coupling or direct coupling or communication connection illustrated or discussed may be via some interfaces, or direct coupling or communication connection of devices or units may be in an electrical, mechanical, or other form.

The units described as separate parts may or may not be physically separated. Parts displayed as units may or may not be physical units, i.e., the parts may be located in one place, or may be distributed on a plurality of network units. Some or all of the units can be selected according to actual needs to achieve purposes of solutions of the embodiments.

Moreover, respective functional units in respective embodiments of the present disclosure may be integrated in one processing unit, or the respective units may be separate physical existence, or two or more units may be integrated in one unit.

If the functions are realized in form of functional software units and are sold or used as separate products, they can be stored in a computer readable storage medium. Based on this understanding, the parts of the technical solutions or the essential parts of the technical solutions (i.e. the parts making a contribution to the related art) can be embodied in form of software product, which is stored in a storage medium, and includes several instruction used for causing a computer device (for example, a personal computer, a server or a network device) to execute all or part of steps in the methods described in respective embodiments of the present disclosure. The above storage medium may be any medium capable of storing program codes, including a USB flash disk, a mobile hard disk, a Read-Only Memory (ROM), a Random Access Memory (RAM), a disc, or a light disk.

Above description is merely specific implementation of the present disclosure. However, the protection scope of the present disclosure is not limited to this. Any change or substitute that is conceivable by those skilled in the art should be in the protection scope of the present disclosure. Thus, the protection scope of the present disclosure should be defined as the protection scope of claims.

What is claimed is:

1. A test system for a charging device, comprising:
   the charging device, comprising a switch tube and a control module; and
   a power supply module, coupled to a control electrode of the switch tube and configured to output a voltage signal to the control electrode of the switch tube, so that a voltage between a first end and a second end of the switch tube is greater than a preset voltage protection value;
   wherein the control module is configured to determine whether the charging device enters a protection state when the voltage between the first end and the second end of the switch tube is greater than the preset voltage protection value, thereby testing a protection function against abnormal voltage drop of the charging device.

2. The test system for the charging device according to claim 1, wherein the charging device further has a charging interface coupled to a load module, in which the first end or the second end of the switch tube is coupled to the load module via the charging interface.

3. The test system for the charging device according to claim 2, wherein the load module is charged with a constant current.

4. The test system for the charging device according to claim 1, wherein the switch tube is an N-type switch tube, and a voltage value of the voltage signal output by the power supply module is gradually reduced.

5. The test system for the charging device according to claim 1, wherein the switch tube is a P-type switch tube, and a voltage value of the voltage signal output by the power supply module is gradually increased.

6. The test system for the charging device according to claim 1, wherein the switch tube is a MOS transistor or a triode.

7. The test system for the charging device according to claim 1, further comprising:
a voltage measurement device, coupled to the first end and the second end of the switch tube respectively, and configured to measure the voltage between the first end and the second end of the switch tube, so that adjusting the voltage value of the voltage signal output by the power supply module is stopped when the voltage between the first end and the second end of the switch tube reaches the preset voltage protection value.

8. The test system for the charging device according to claim 1, wherein the control module is configured to detect the voltage between the first end and the second end of the switch tube through a voltage detection unit, and to control the charging device to enter the protection state when the protection function against abnormal voltage drop of the charging device is normal and the voltage between the first end and the second end of the switch tube is greater than the preset voltage protection value.

9. The test system for the charging device according to claim 1, wherein the power supply module is a direct current power supply, a positive electrode of the direct current power supply is coupled to the control electrode of the switch tube, and a negative electrode of the direct current power supply is grounded.

10. The test system for the charging device according to claim 1, wherein the charging interface has a positive power line coupled to a positive output end of a charging circuit of the charging device and a negative power line coupled to a negative output end of the charging circuit of the charging device, in which the switch tube is coupled in series with the positive power line or the negative power line.

11. The test system for the charging device according to claim 1, further comprising:
a prompt module, coupled to the control module and configured to provide a prompt on a test result of the protection function against abnormal voltage drop or a protection state of the charging device under control of the control module.

12. A test method for a charging device, comprising:
outputting a voltage signal to a control electrode of a switch tube in the charging device, so as to enable a voltage between a first end and a second end of the switch tube to be greater than a preset voltage protection value; and
determining an operating state of the charging device when the voltage between the first end and the second end of the switch tube is greater than the preset voltage protection value, thereby testing a protection function against abnormal voltage drop of the charging device.

13. The test method for the charging device according to claim 12, further comprising:
adjusting the voltage between the first end and the second end of the switch tube by maintaining the current flowing through the switch tube constant and adjusting a voltage value of the voltage signal outputted to the control electrode of the switch tube.

14. The test method for the charging device according to claim 13, wherein the switch tube is an N-type switch tube, and the voltage value of the voltage signal output to the control electrode of the switch tube is gradually reduced.

15. The test method for the charging device according to claim 13, wherein the switch tube is a P-type switch tube, and the voltage value of the voltage signal output to the control electrode of the switch tube is gradually increased.

16. The test method for the charging device according to claim 13, further comprising:
measuring the voltage between the first end and the second end of the switch tube, and stopping adjusting the voltage value of the voltage signal output when the voltage between the first end and the second end of the switch tube reaches the preset voltage protection value.

17. The test method for the charging device according to claim 12, further comprising:
measuring the voltage between the first end and the second end of the switch tube, and controlling the charging device to enter a protection state when the protection function against abnormal voltage drop of the charging device is normal and the voltage between the first end and the second end of the switch tube is greater than the preset voltage protection value.

18. The test method for the charging device according to claim 12, further comprising:
providing a prompt on a test result of the protection function against abnormal voltage drop or a protection state of the charging device.

* * * * *